(12) United States Patent
Alrod et al.

(10) Patent No.: US 9,785,501 B2
(45) Date of Patent: Oct. 10, 2017

(54) ERROR DETECTION AND HANDLING FOR A DATA STORAGE DEVICE

(71) Applicant: SANDISK TECHNOLOGIES INC., Plano, TX (US)

(72) Inventors: Idan Alrod, Herzliya (IL); Eran Sharon, Rishon Lezion (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 290 days.

(21) Appl. No.: 14/182,567

(22) Filed: Feb. 18, 2014

(65) Prior Publication Data

US 2015/0234706 A1   Aug. 20, 2015

(51) Int. Cl.
| | | |
|---|---|---|
| *G06F 11/10* | (2006.01) | |
| *G06F 11/07* | (2006.01) | |
| *G11C 11/56* | (2006.01) | |
| *G11C 29/52* | (2006.01) | |
| *G11C 29/04* | (2006.01) | |

(52) U.S. Cl.
CPC ........ *G06F 11/1072* (2013.01); *G06F 11/076* (2013.01); *G11C 11/5642* (2013.01); *G11C 29/52* (2013.01); *G06F 2212/403* (2013.01); *G11C 2029/0411* (2013.01); *G11C 2211/5621* (2013.01)

(58) Field of Classification Search
CPC ............ G06F 11/1012; G06F 11/1072; G11C 2211/5641
USPC ................................. 714/710, 711, 718–724
See application file for complete search history.

(56) References Cited

U.S. PATENT DOCUMENTS

| | | | | |
|---|---|---|---|---|
| 4,506,362 A * | 3/1985 | Morley | ................. | G06F 11/106 714/6.1 |
| 5,675,544 A * | 10/1997 | Hashimoto | ............ | G11C 29/26 365/189.04 |
| 5,954,828 A * | 9/1999 | Lin | ......................... | G11C 29/88 365/201 |
| 6,456,528 B1 * | 9/2002 | Chen | ....................... | G11C 11/56 365/185.03 |
| 6,640,321 B1 * | 10/2003 | Huang | ................... | G11C 29/24 714/718 |
| 7,630,252 B2 * | 12/2009 | Lin | ..................... | G11C 11/5628 365/185.03 |
| 7,925,936 B1 * | 4/2011 | Sommer | ............. | G11C 11/5628 714/704 |
| 8,386,890 B2 * | 2/2013 | Wezelenburg | ...... | G06F 11/1072 714/764 |
| 2007/0002631 A1 * | 1/2007 | Kang | .................. | G11C 11/5628 365/185.21 |
| 2007/0262890 A1 * | 11/2007 | Cornwell | ................. | G11C 7/16 341/51 |
| 2009/0132876 A1 * | 5/2009 | Freking | ................. | G06F 11/106 714/723 |
| 2011/0096601 A1 * | 4/2011 | Gavens | .............. | G11C 11/5628 365/185.09 |

(Continued)

*Primary Examiner* — Steve Nguyen
(74) *Attorney, Agent, or Firm* — Toler Law Group, PC

(57) ABSTRACT

A data storage device includes a non-volatile memory and a controller. A method includes writing a first logical page to a physical page of the non-volatile memory. In response to a multistate error indication satisfying a threshold, the method further includes rewriting the first logical page at the non-volatile memory. The multistate error indication is determined based on the first logical page.

26 Claims, 7 Drawing Sheets

(56) References Cited

U.S. PATENT DOCUMENTS

| | | |
|---|---|---|
| 2011/0141817 A1 | 6/2011 | Takagiwa |
| 2011/0235431 A1 | 9/2011 | Takagiwa |
| 2012/0102379 A1* | 4/2012 | D'Abreu ............. G06F 11/1072 |
| | | 714/763 |
| 2013/0031430 A1* | 1/2013 | Sharon ................ G11C 11/5642 |
| | | 714/719 |
| 2013/0031431 A1 | 1/2013 | Sharon et al. |
| 2013/0055047 A1* | 2/2013 | Sharon .................... G11C 29/52 |
| | | 714/764 |
| 2013/0094288 A1* | 4/2013 | Patapoutian ........... G11C 16/06 |
| | | 365/185.03 |
| 2013/0114344 A1* | 5/2013 | Sakai ................ G11C 11/5628 |
| | | 365/185.18 |
| 2013/0343131 A1* | 12/2013 | Wu ........................ G11C 16/26 |
| | | 365/185.24 |

\* cited by examiner

ERROR DETECTION AND HANDLING FOR A DATA STORAGE DEVICE

FIELD OF THE DISCLOSURE

The present disclosure is generally related to detection and handling of errors in data stored at a data storage device.

BACKGROUND

Non-volatile data storage devices, such as embedded memory devices and removable memory devices, have enabled increased portability of data and software applications. For example, multi-level cell (MLC) storage elements of a flash memory device may each store multiple bits of data, enhancing data storage density as compared to single-level cell (SLC) flash memory devices. As a result, flash memory devices may enable users to store and access a large amount of data.

Storing multiple bits of data in a single flash memory cell typically includes mapping sequences of bits to states of the flash memory cell. For example, a first sequence of bits "11" may correspond to a first state of a flash memory cell, and a second sequence of bits "00" may correspond to a second state of the flash memory cell. After determining that a sequence of bits is to be stored into a particular flash memory cell, the particular flash memory cell may be programmed to a state (e.g., by storing a threshold voltage at the particular flash memory cell) that corresponds to the sequence of bits.

Once memory cells in a data storage device have been programmed, data may be read from the memory cells by sensing the programmed state of each memory cell (e.g., by comparing the cell threshold voltage to one or more read voltages). However, the sensed programming states can sometimes vary from the written programmed states due to one or more factors. For example, factors such as data retention and program disturb conditions tend to shift a threshold voltage of a memory cell from an originally programmed state of the memory cell toward a higher-voltage state of the memory cell or toward a lower-voltage state of the memory cell. Such factors may cause the memory cell to be read as being in a state adjacent to the originally programmed state, corresponding to a "single-state error." Multistate errors that cause a memory cell to be in a state that is multiple states from the "correct" state of the memory cell may occur less frequently than single-state errors and may be more difficult to detect and correct than single-state errors. Multistate errors and other types of errors may complicate decoding of data, consuming resources at a data storage device. In some cases, a number of errors may exceed an error correction capability of a decoder of the data storage device, resulting in data loss.

SUMMARY

Accuracy of reading data stored in a data storage device may be improved without compromising read performance of the data storage device by determining a multistate error indication of the data upon writing the data. One or more multistate errors in the data may be corrected prior to responding to a request for read access to the data instead of attempting to correct the multistate errors during the read operation using a decoding technique.

To illustrate, a first logical page may be written as a lower page at a non-volatile memory of a data storage device. The data storage device may determine that a second logical page is to be written as an upper page corresponding to the lower page. In order to write the upper page, the data storage device may provide both the lower page and the upper page to internal latches of the non-volatile memory to enable concurrent writing of the upper and lower pages at the non-volatile memory. If the first logical page is unavailable in digital form (e.g., from a host device), the data storage device may generate the first logical page by sensing the first logical page from the non-volatile memory into the internal latches. Sensing the first logical page from the non-volatile memory into the internal latches may cause one or more errors in the first logical page. An error in sensing the lower page may translate to a multistate error when both the upper and lower pages are written to the non-volatile memory. Moreover, these errors may be associated (erroneously) with high reliability measures, which may degrade performance at the data storage device during decoding operations that utilize reliability information, such as log-likelihood ratios (LLRs).

An error-detecting write process in accordance with the present disclosure may include writing a first logical page at a physical page of the data storage device. After writing the first logical page, the error-detecting write process may further include sensing the first logical page and evaluating the first logical page to determine a multistate error indication of the first logical page, such as by determining whether the first logical page includes one or more multistate errors. The error-detecting write process may be performed either concurrently with or after writing a second logical page at the physical page, such as in connection with a multistage write process that writes multiple logical pages to the physical page.

The multistate error indication may be determined according to a particular technique. The technique may analyze the first logical page to determine information that indicates whether one or more multistate errors likely have occurred as a result of writing the second logical page or likely will occur as a result of writing the second logical page. Example techniques for determining the multistate error indication are described further below.

According to a first technique, the data storage device may perform an erratic program detection (EPD) estimation process. The EPD estimation process may determine the multistate error indication by analyzing the first logical page to determine a number of storage elements that store threshold voltages that are "between" states of the first logical page (e.g., in a region that separates states of the first logical page). Because the data storage device may "misread" the threshold voltages that are "between" states during the multistage write process, such threshold voltages may cause multistate errors. In this example, the multistate error indication may include a parameter that indicates the number of storage elements that store threshold voltages that are "between" threshold voltage states.

According to a second technique, the data storage device may estimate a bit error rate (BER) of the first logical page. A high BER of the first logical page may indicate that one or more multistate errors likely have occurred while writing the second logical page or are likely to occur while writing the second logical page. For example, a high BER may indicate over-programming or under-programming of one or more storage elements (e.g., by using too many or too few programming pulses when programming the first logical page). In this example, the multistate error indication may include a parameter that indicates the BER of the first logical page.

According to a third technique, the data storage device may decode a first portion of the first logical page. To illustrate, a decoder of the data storage device may decode part, but not all, of the first logical page, such as by decoding a "sample" portion of the first logical page. The decoder may determine a decoded error rate of the decoded portion of the first logical page. In this example, the multistate error indication may include a parameter that indicates the decoded error rate of the decoded portion.

According to a fourth technique, the data storage device may read a header (e.g., a preamble or a "flag") associated with the first logical page. The header may be unprotected by any error correcting code (ECC) technique. As a particular example, the header may be protected via a "repetition" code that repeats each bit of the header instead of via a "full" ECC technique, such as an iterative ECC technique. Accordingly, if the header can be correctly read by the data storage device, then the first logical page is likely to have been written reliably. Alternatively, if the header includes a large number of errors (e.g., causing the header to be read incorrectly), then the data storage device may determine that the first logical page likely contains one or more errors that may lead to one or more multistate errors during the multistage write process. In this example, the multistate error indication may include a parameter that indicates the error rate of the header.

If the indication indicates a low number of multistate errors in the sensed first logical page, the error-detecting write process may continue, such as by completing programming of the second logical page at the data storage device. If the indication indicates a high number of multistate errors of the first logical page, the first logical page may be rewritten at the data storage device. For example, a first copy of the first logical page stored at the physical page may be invalidated. The first logical page may be decoded to correct one or more multistate errors to generate a second copy of the first logical page, and the second copy of the first logical page may be written at the non-volatile memory.

By determining the multistate error indication during the error-detecting write process (e.g., based on one or more errors associated with a lower page), a multistate error rate of data may be reduced while also reducing a latency associated with correction of multistate errors. For example, certain conventional devices may either decode each sensed lower page to correct errors in the sensed lower page during a multistage write process (resulting in latency) or may tolerate a high multistate error rate in stored data (which may result in uncorrectable data errors in some cases). Such devices may therefore attempt to achieve a "tradeoff" between latency (and a lower multistate error rate) and a number of multistate errors (and a low latency).

A data storage device in accordance with the present disclosure may achieve low latency (e.g., may reduce or avoid instances of transferring sensed lower pages to a controller for decoding during a multistate write process to correct errors) while also enabling a low multistate error rate in stored data (e.g., by preventing or correcting errors during or upon completing a multistage write process). In accordance with the present disclosure, one or more fast error estimation techniques (e.g., the techniques described above) may be applied to a lower page. If a determination is made that the lower page contains (or may contain) a number of errors exceeding a threshold, then the lower page may be transferred to the controller for decoding. If the number of errors does not exceed the predefined threshold, the data corresponding to the lower page may be taken from the latches (into which the lower page was sensed) and programmed to the non-volatile memory concurrently with an upper page. Such a technique reduces latency significantly, since most pages are not likely to contain a high number of errors. According to further embodiments of the present disclosure, additional error detection and correction techniques are disclosed, such as an error-detecting read process, as described further below with reference to the Drawings and the Detailed Description.

DETAILED DESCRIPTION

Figure 1:
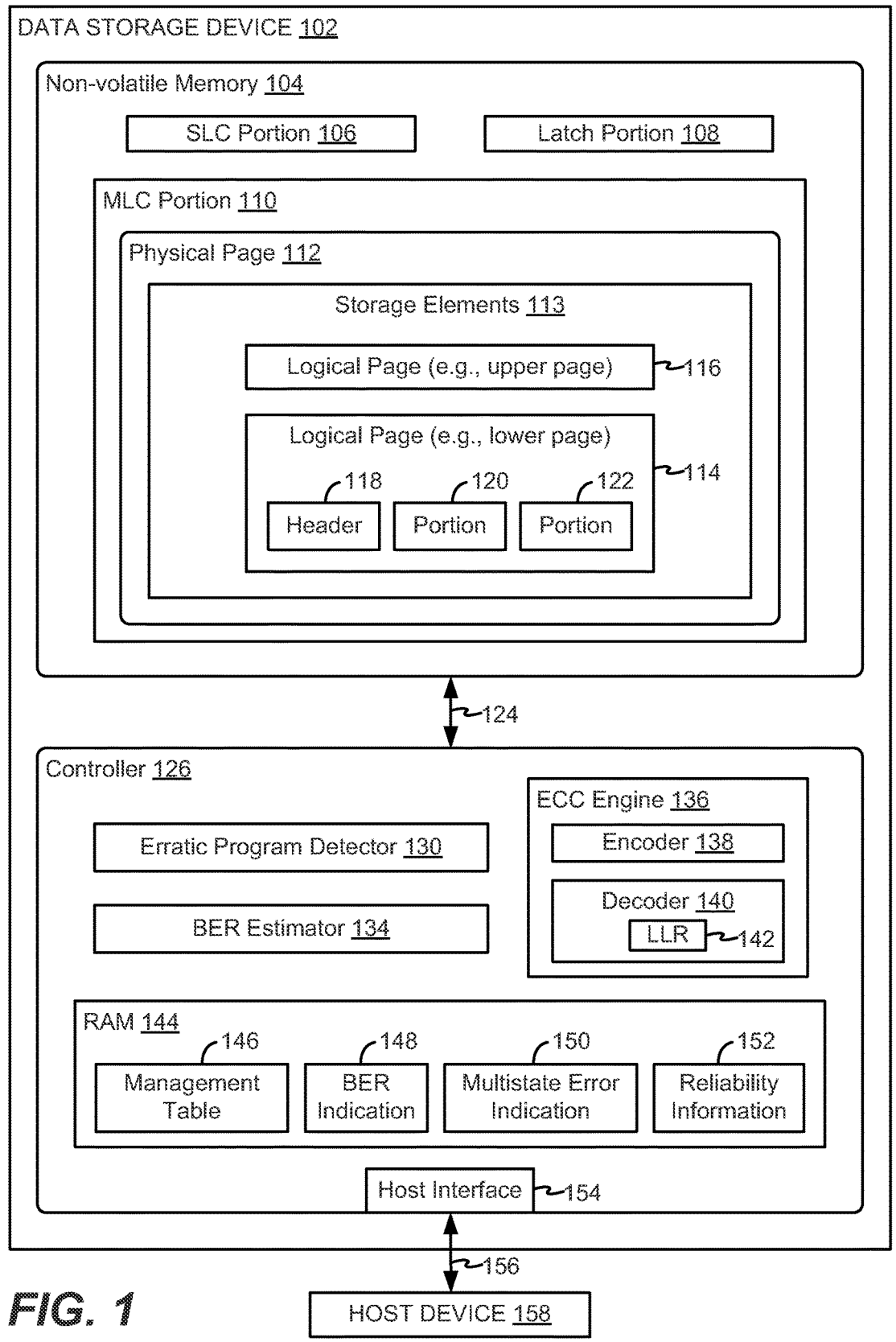
FIG. 1 is a diagram of a particular illustrative embodiment of a system that includes a data storage device.

Referring to FIG. 1, a particular illustrative embodiment of a system is depicted and generally designated 100. The system 100 includes a data storage device 102 and a host device 158. The data storage device 102 and the host device 158 may be coupled via a connection 156 (e.g., a bus). The data storage device 102 may be embedded within the host device 158, such as in accordance with a Joint Electron Devices Engineering Council (JEDEC) Solid State Technology Association Universal Flash Storage (UFS) configuration. Alternatively, the data storage device 102 may be removable from the host device 158 (i.e., "removably" coupled to the host device 158 via the connection 156). As an example, the data storage device 102 may be removably coupled to the host device 158 in accordance with a removable universal serial bus (USB) configuration.

The data storage device 102 may include a memory (e.g., a non-volatile memory 104) and a controller 126. The non-volatile memory 104 and the controller 126 may be coupled via a connection 124 (e.g., a bus).

The non-volatile memory 104 may include a single level cell (SLC) portion 106, a latch portion 108, and a multi-level cell (MLC) portion 110. The MLC portion 110 may include one or more physical pages, such as a physical page 112 (e.g., a word line of the non-volatile memory 104). The physical page 112 may include storage elements 113. Although not depicted in FIG. 1, the SLC portion 106 and the MLC portion 110 may each include multiple physical pages.

The storage elements 113 may correspond to MLC storage elements that are each configured to store a threshold voltage indicating multiple data bits. To illustrate, the storage elements 113 may include a first storage element that stores a threshold voltage indicating a bit of a logical page 114 and further indicating a bit of a logical page 116. The logical page 114 may correspond to a lower page written in accordance with a multistage write process, and the logical page 116 may correspond to an upper page written in accordance with the multistage write process. In this example, the storage elements 113 may have a two-bit-per-cell ("X2") configuration. In other examples, the storage elements 113 may have a three-bit-per-cell ("X3") configuration, or another configuration.

The logical pages 114, 116 may include data and other information, such as header information. To illustrate, FIG. 1 depicts that the logical page 114 includes a header 118 and portions 120, 122 (e.g., data portions). The header 118 may include metadata associated with the logical page 114. In certain embodiments, the header 118 is unprotected by an error correcting code (ECC) technique (i.e., is not encoded).

The controller 126 may include an erratic program detector 130, a bit error rate (BER) estimator 134, an error correcting code (ECC) engine 136, a random access memory (RAM) 144, and a host interface 154. The ECC engine 136 may include an encoder 138 and a decoder 140. The decoder 140 may be configured to decode ECC codewords using one or more log-likelihood ratios (LLRs), such as an LLR 142. The RAM 144 may be configured to store information usable by the controller 126, such as a management table 146, a bit error rate (BER) indication 148, a multistate error indication 150, and reliability information 152. Although the example of FIG. 1 depicts that the controller 126 includes the erratic program detector 130, it should be appreciated that one or more components of the controller 126 may be included in the non-volatile memory 104. For example, to facilitate rapid error detection and correction, one or more components of the controller 126 may be included in the non-volatile memory 104. To illustrate, the erratic program detector 130 may be included in the latch portion 108 in order to avoid transfer of data from the latch portion 108 to the controller 126 during an erratic program detection (EPD) estimation process, as described further below.

The controller 126 is configured to receive data and instructions from the host device 158 via the connection 156 and to send data to the host device 158 via the connection 156. For example, the controller 126 may send data to the host device 158 via the connection 156 and may receive data from the host device 158 via the connection 156. The controller 126 may store (e.g., buffer) data at a cache or a memory, such as at the RAM 144.

The controller 126 is configured to send data and commands to the non-volatile memory 104 via the connection 124 and to receive data from the non-volatile memory 104 via the connection 124. For example, the controller 126 is configured to send data and a write command via the connection 124 to cause the non-volatile memory 104 to store the data to a specified address of the non-volatile memory 104. The data may include one or more error correcting code (ECC) codewords generated by the encoder 138. To illustrate, the logical pages 114, 116 may be (or may include) ECC codewords generated by the encoder 138.

The controller 126 is configured to send a read command via the connection 124 to sense data from a specified address of the non-volatile memory 104. As an example, the controller 126 may send a read command to sense data (e.g., one or more ECC codewords) stored at the physical page 112. The decoder 140 may be configured to decode ECC codewords read from the non-volatile memory 104. To illustrate, the logical pages 114, 116 may be (or may include) ECC codewords that can be decoded by the decoder 140.

The ECC engine 136 may be configured to receive data and to generate one or more ECC codewords based on the data. For example, the encoder 138 may be configured to encode data using an ECC encoding technique. The encoder 138 may include a Reed-Solomon encoder, a Bose-Chaudhuri-Hocquenghem (BCH) encoder, a low-density parity check (LDPC) encoder, a turbo encoder, an encoder configured to encode data according to one or more other ECC techniques, or a combination thereof. The decoder 140 may be configured to decode data read from the non-volatile memory 104 to detect and correct, up to an error correction capability of an ECC technique used by the ECC engine 136, bit errors that may be present in the read data.

The host device 158 may correspond to a mobile telephone, a music player, a video player, a gaming device or console, an electronic book reader, a personal digital assistant (PDA), a computer, such as a laptop, a tablet, or a notebook computer, a portable navigation device, another electronic device, or a combination thereof. The host device 158 may communicate via a host controller, which may enable the host device 158 to communicate with the data storage device 102. The host device 158 may operate in compliance with a JEDEC Solid State Technology Association industry specification, such as an embedded MultiMedia Card (eMMC) specification or a Universal Flash Storage (UFS) Host Controller Interface specification. The host device 158 may operate in compliance with one or more other specifications, such as a Secure Digital (SD) Host Controller specification as an illustrative example. Alternatively, the host device 158 may communicate with the data storage device 102 in accordance with another communication protocol.

In operation, the controller 126 may write one or more logical pages to the non-volatile memory 104. To illustrate, the controller 126 may be configured to perform a multistage write process (e.g., a "foggy-fine" write process) that writes multiple logical pages to a single physical page, such as the physical page 112. In a particular example, the controller 126 may initiate the multistage write process by writing the logical page 114 to the physical page 112 (e.g., by copying the logical page 114 from the SLC portion 106 to the physical page 112). The controller 126 may continue the multistage write process by moving the logical page 114 from the physical page 112 to the latch portion 108 and by writing the logical pages 114, 116 to the physical page 112. In the example depicted in FIG. 1, the logical pages 114, 116 have been written to the physical page 112.

The logical pages 114, 116 may be written sequentially to the physical page 112. For example, the controller 126 may cause the non-volatile memory 104 to write the logical page 114 to the physical page 112. If writing the logical page 114 to the physical page 112 is successful, the controller 126 may command the non-volatile memory 104 to complete the multistage write process by writing the logical page 116 to the physical page 112.

In certain cases, reliability of one or more of the logical pages 114, 116 may be compromised due to one or more errors that occur during the multistage write process. For example, factors such as data retention and program disturb conditions may shift a threshold voltage of one of the storage elements 113 from a target threshold voltage state toward a higher threshold voltage state or toward a lower threshold voltage state. Such factors may cause the storage element to be read as being in a state adjacent to the originally programmed state, resulting in a "single-state error." Multistate errors that cause a storage element to be in a state that is multiple states from the "correct" state may occur less frequently than single-state errors and may be more difficult to detect and correct than single-state errors. Multistate errors and other types of errors may complicate decoding of data, consuming resources at the data storage device 102. In some cases, a number of errors may exceed an error correction capability of the decoder 140, causing data loss.

An error-detecting write process in accordance with the present disclosure determines the multistate error indication 150 in connection with (e.g., concurrently with, immediately thereafter, etc.) a multistage write process that writes multiple logical pages to a single physical page of the non-volatile memory 104 (e.g., by writing the logical pages 114, 116 to the physical page 112). The multistate error indication 150 may indicate that one or more multistate errors are present (or are likely to be present) in data stored at the non-volatile memory 104. Example techniques for determining the multistate error indication 150 are described further below.

According to a first technique, the erratic program detector 130 may perform an erratic program detection (EPD) estimation process. The EPD estimation process may determine the multistate error indication 150 by analyzing the logical page 114 to determine a number of the storage elements 113 that store threshold voltages that are "between" threshold voltage states of the logical page 114 (e.g., in a region that separates threshold voltage states of the logical page 114). For example, to avoid latency associated with transferring data from the non-volatile memory 104 to the controller 126 during a multistage write process, certain pages may be written the non-volatile memory 104 without error correction (e.g., decoding) during the multistage write process, which may result in one or more errors in the data (e.g., threshold voltages that are "between" states). Because the data storage device 102 may "misread" threshold voltages that are "between" threshold voltage states during the multistage write process, such threshold voltages may cause one or more errors, such as multistate errors during the multistage write process. The erratic program detector 130 may perform the EPD estimation process to detect and correct one or more such errors. In this example, the multistate error indication 150 corresponds to the number of storage elements that store threshold voltages that are "between" threshold voltage states of the logical page 114. For example, the multistate error indication 150 may include a parameter indicating the number of storage elements that store threshold voltages that are "between" threshold voltage states of the logical page 114.

According to a second technique, the BER estimator 134 may estimate a BER of the logical page 114 by generating the BER indication 148. The BER indication 148 may indicate the estimated BER of the logical page 114. A high BER of the logical page 114 may indicate that one or more multistate errors likely have occurred while writing the logical page 116 or are likely to occur while writing the logical page 116. For example, a high BER may indicate over-programming or under-programming of one or more of the storage elements 113 (e.g., by using too many or too few programming pulses when programming the logical page 114). In this example, the multistate error indication 150 corresponds to the BER of the logical page 114. For example, the multistate error indication 150 may include a parameter indicating the BER of the logical page 114.

According to a third technique, the decoder 140 may decode a first portion of the logical page 114. To illustrate, the decoder 140 may decode part, but not all, of the logical page 114, such as by decoding a "sample" portion of the logical page 114. The "sample" portion may correspond to one of the portions 120, 122. The decoder 140 may determine a decoded error rate of the sample portion of the logical page 114. In this example, the multistate error indication 150 corresponds to the decoded error rate of the sample portion of the logical page 114. For example, the multistate error indication 150 may include a parameter indicating the decoded error rate of the sample portion of the logical page 114.

According to a fourth technique, the data storage device 102 may read the header 118. In certain configurations of the data storage device 102, the header 118 is unprotected by an ECC technique. As a particular example, the header 118 may be protected via a "repetition" code that repeats bits of the header 118 instead of being encoded via a "full" ECC technique (e.g., an iterative ECC technique, such as an LDPC technique). Accordingly, if the header 118 can be correctly read by the data storage device 102, then the logical page 114 is likely to have been written reliably. Alternatively, if the header 118 includes a large number of errors (e.g., causing the header 118 to be read incorrectly), then the data storage device 102 may determine that the logical page 114 likely contains one or more errors that may lead to one or more multistate errors during the multistage write process. In this example, the multistate error indication 150 corresponds to the error rate of the header 118. For example, the multistate error indication 150 may include a parameter indicating a number of errors associated with the header 118.

Upon determination of the multistate error indication 150, the controller 126 may compare the multistate error indication 150 to a threshold. If the multistate error indication 150 fails to satisfy the threshold, the controller 126 may update the management table 146, such as by updating the management table 146 to indicate that a logical address associated with the logical page 114 corresponds to a physical address associated with the physical page 112. If the multistate error indication 150 satisfies the threshold, the controller 126 may command the non-volatile memory 104 to rewrite the logical page 114 at the non-volatile memory 104. The logical page 114 may be rewritten at the physical page 112, at another physical page of the MLC portion 110 (not shown in FIG. 1), at a recovery block, which may correspond to the SLC portion 106, or at another location of the non-volatile memory 104.

By determining the multistate error indication 150 during the error-detecting write process, accuracy of reading data at the data storage device 102 is improved. Further, a latency associated with a multistage write operation may be reduced by selectively decoding one or more sensed lower pages based on the multistate error indication 150. For example, sensed lower pages may be selectively decoded and error-corrected instead of transferring each sensed lower page to the controller 126 for error correction using a decoding technique, which may consume time, processing resources, and power.

In addition, the error-detecting write process described with reference to FIG. 1 may reduce a duration of the write process as compared to certain conventional write processes. For example, during a multistage write process, a conventional device may decode each logical page to correct one or more errors upon copying each logical page to a latch portion. However, fully decoding each logical page consumes processing resources of a data storage device. Instead of fully decoding each logical page, the data storage device 102 may determine the multistate error indication 150, which typically consumes fewer processing resources than a full decode. Because most logical pages will not have a high error rate, processing resources at the data storage device 102 are conserved as compared to decoding each logical page upon copying each logical page into the latch portion 108.

As used herein, "multistate error indication" may refer to information generated by the data storage device 102 that indicates that one or more multistate errors have occurred, will occur, are likely to have occurred, and/or are likely to occur during a multistage write process that writes data. Such information may indicate a parameter (e.g., a number) that the controller 126 may compare to another number, such as a threshold. The threshold may be determined based on the particular application, such as based on the particular error correction capability of the decoder 140. As used herein, a storage element may be associated with a "multistate error" when the storage element has a state that is multiple states from the target (or "correct") state of the storage element. Multistate errors are described further with reference to FIG. 2.

Figure 2:
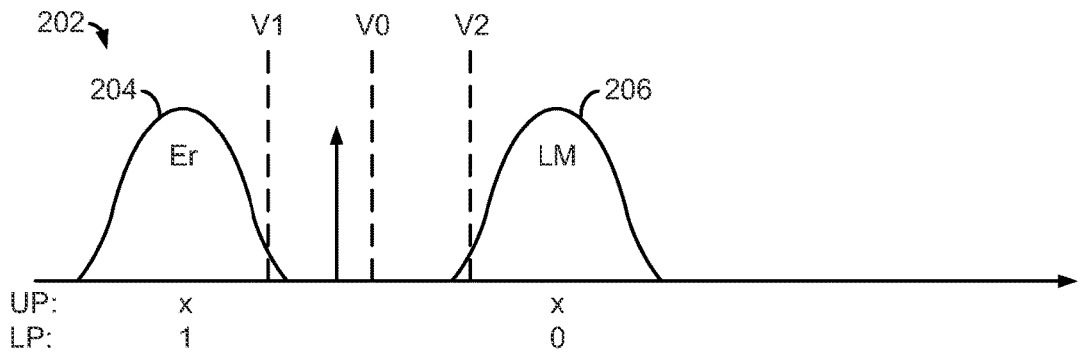
FIG. 2 is a diagram that depicts histograms illustrating threshold voltages that may be programmed at the data storage device of FIG. 1.
Figure 2:
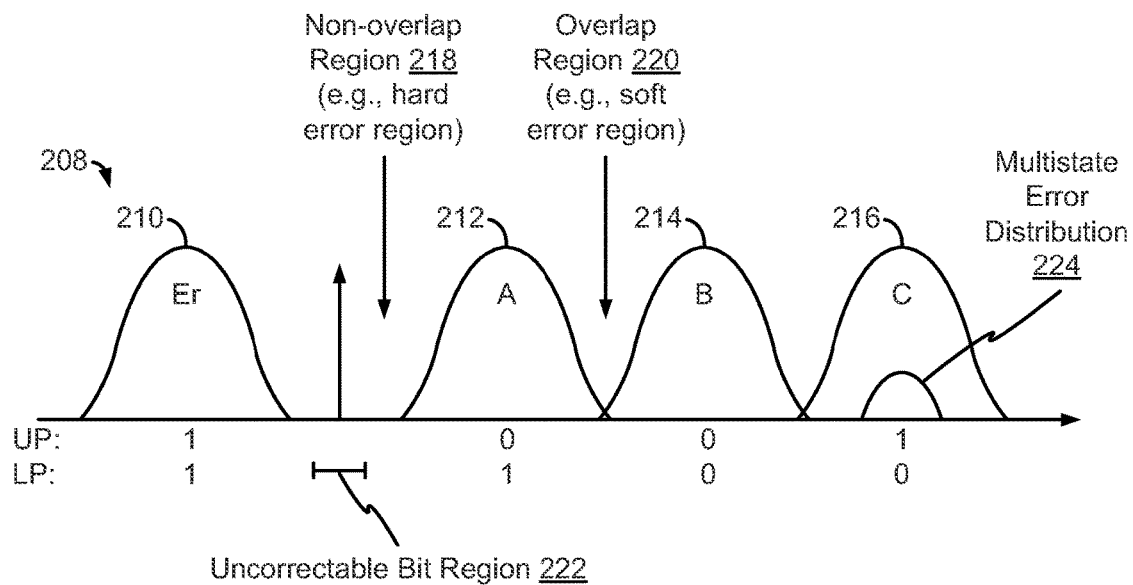
Figure 2:
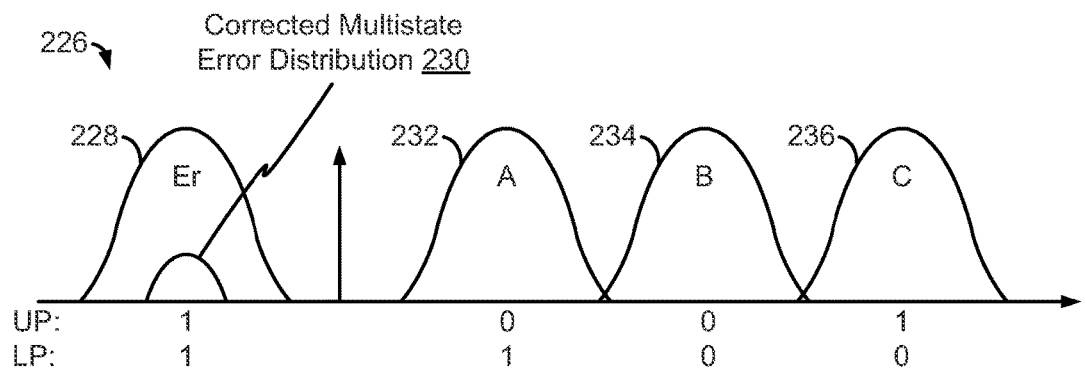

FIG. 2 illustrates histograms 202, 208, and 226. The histograms 202, 208, and 226 may correspond to threshold voltages that can be programmed at the non-volatile memory 104, such as at the MLC portion 110. In FIG. 2, each abscissa indicates threshold voltages of storage elements of the non-volatile memory 104, and each ordinate indicates a number of storage elements of the non-volatile memory 104 having a particular threshold voltage. The storage elements may correspond to the storage elements 113. In a particular embodiment, each of the histograms 202, 208, and 226 indicates a particular state of the physical page 112.

The histogram 202 includes an erase state distribution 204 and a "low-to-middle" (LM) state distribution 206. The erase state distribution 204 and the LM state distribution 206 may correspond to bit values of a lower page (LP) programmed at the data storage device 102. For example, storage elements programmed to a threshold voltage within the erase state distribution 204 may be associated with a lower page bit value of "1," and storage elements programmed to a threshold voltage within the LM state distribution 206 may be associated with a lower page bit value of "0." In a particular embodiment, the histogram 202 indicates a distribution of threshold voltages stored at the storage elements 113 after programming the logical page 114 and before programming the logical page 116 at the physical page 112. The logical page 114 may correspond to the lower page described with reference to FIG. 2. The threshold voltages can be sensed by applying one or more read voltages to storage elements of the non-volatile memory 104, such as by applying a read voltage V1, a read voltage V0, a read voltage V2, another read voltage, or a combination thereof. The threshold voltages indicating the lower page may be sensed from the non-volatile memory 104 in response to a determination that data corresponding to the lower page is unavailable via the host device 158 or at the controller 126.

Multistate errors can arise due to over-programming or under-programming of storage elements at the non-volatile memory 104. For example, if a storage element that is targeted to store an erase state threshold voltage (i.e., a lower page value of "1" in the histogram 202) is over-programmed (e.g., by applying too many programming pulses to the storage element), then the storage element may inadvertently be sensed as storing an "LM" state threshold voltage (i.e., a lower page value of "0" in the histogram 202). During a multistage write process that "divides" the erase state distribution 204 into two upper page state distributions (e.g., distributions of "11" and "01" states) and that "divides" the LM state distribution 206 into two upper page state distributions (e.g., distributions of "00" and "10" states), the over-programmed storage element may be inadvertently programmed to a "10" state instead of to a "11" state due to the error in the lower page value, resulting in a multistate error (because the programmed state is multiple states from the target state). Similarly, an under-programmed storage element may be sensed as storing a lower page value of "1" instead of a lower page value of "0," which may cause the storage element to be programmed to a "11" state instead of to a "10" state, resulting in a multistate error at the storage element (because the programmed state is multiple states from the target state).

Multistate errors may be more difficult to correct than single-state errors. For example, multistate errors may tend to occur near the centers of threshold voltage distributions (instead of falling outside the threshold voltage distributions). One reason for multistate errors occurring near the centers of threshold voltage distributions is that a multistate error may result from incorrectly decoding (or sensing) a lower page value. During a multistage write process, upper and lower pages may be programmed "correctly" (e.g., in the center of a target distribution) but based on the incorrectly decoded (or sensed) lower page value (i.e., using incorrect information regarding the "correct" lower page value). Therefore, certain decoding techniques (e.g., soft bit information techniques) may be ineffective or may even be counterproductive, since the multistate errors may be erroneously associated with a high reliability (e.g., may be associated with an LLR having a high positive value by virtue of occurring near the center of a threshold voltage distribution).

The histogram 208 includes an erase state distribution 210, an "A" state distribution 212, a "B" state distribution 214, and a "C" state distribution 216. Each distribution of the histogram 208 may be associated with a particular lower page bit value and a particular upper page (UP) bit value. In the particular example of FIG. 2, the erase state distribution 210 corresponds to a "11" state, the "A" state distribution 212 corresponds to a "01" state, the "B" state distribution 214 corresponds to a "00" state, and the "C" state distribution 216 corresponds to a "10" state. The histogram 208 may correspond to a state of the physical page 112 after a particular state of a multistage write process. For example, the histogram 208 may correspond to a state of the physical page 112 after "dividing" the erase state distribution 204 into the erase state distribution 210 and the "A" state distribution 212 and after "dividing" the LM state distribution 206 into the "B" state distribution 214 and the "C" state distribution 216.

In the example of FIG. 2, the "C" state distribution 216 includes a multistate error distribution 224. The multistate error distribution 224 may correspond to threshold voltages targeted for the erase state distribution 210. For example, storage elements targeted to store a lower page bit value of "1" and an upper page bit value of "1" but that store a lower page bit value of "0" and an upper page bit value of "1" may be included in the multistate error distribution 224.

The histogram 208 further indicates an overlap region 220, a non-overlap region 218, and an uncorrectable bit region 222 (e.g., a range of threshold voltages that cannot be corrected using soft bit information). The overlap region 220 may correspond to a "soft" error region. Threshold voltages falling within the overlap region 220 may be correctable (or likely correctable) by the ECC engine 136. The non-overlap region 218 may correspond to a "hard" error region. For example, bit errors occurring in the non-overlap region 218 may typically be difficult to correct by the ECC engine 136 and may correspond to errors that have a lower decoding success rate than soft errors. It should be appreciated that the overlap region 220, the non-overlap region 218, and the uncorrectable bit region 222 are provided for illustrative purposes and that one or more other regions of the histograms 202, 208, and 226 may correspond to an overlap region, a non-overlap region 218, and an uncorrectable bit region.

The histogram 226 includes an erase state distribution 228, a corrected multistate error distribution 230, an "A" state distribution 232, a "B" state distribution 234, and a "C" state distribution 236. In the histogram 226, the multistate error distribution 224 of the histogram 208 has been corrected to fall within the erase state distribution 228, generating the corrected multistate error distribution 230. In a particular embodiment, the histogram 226 corresponds to threshold voltages of the logical pages 114, 116 after the logical pages 114, 116 are rewritten at the non-volatile memory 104 (e.g., rewritten after determining that the multistate error indication 150 satisfies the threshold). In an alternative embodiment, the upper page indicated by the histogram 208 may be maintained. In this case, the logical page 114 (and not the logical page 116) may be rewritten, such as to the SLC portion 106.

Accordingly, the logical page 114 may be rewritten at the non-volatile memory 104 based on the multistate error indication 150. Rewriting the logical page 114 may "correct" one or more multistate errors (e.g., by transferring the logical page to the controller 126 for decoding by the decoder 140). For example, rewriting the logical page 114 may correct the multistate error distribution 224 by correcting threshold voltages of storage elements from states corresponding to the multistate error distribution 224 to states corresponding to the corrected multistate error distribution 230. Correcting threshold voltages of storage elements from states corresponding to the multistate error distribution 224 to states corresponding to the corrected multistate error distribution 230 may simplify decoding of the logical page 114 after completion of the multistage write process. Further, the threshold voltages may be corrected without appreciably increasing latency associated with the multistage write process. For example, because most pages are not statistically expected to have a high error rate, a small number of pages may be transferred to the controller for error correction (e.g., full decoding by the decoder 140). Therefore, the techniques described with reference to FIG. 2 may enable low multistate error rates in stored data while also accruing little (or no) latency at the data storage device 102.

Figure 3:
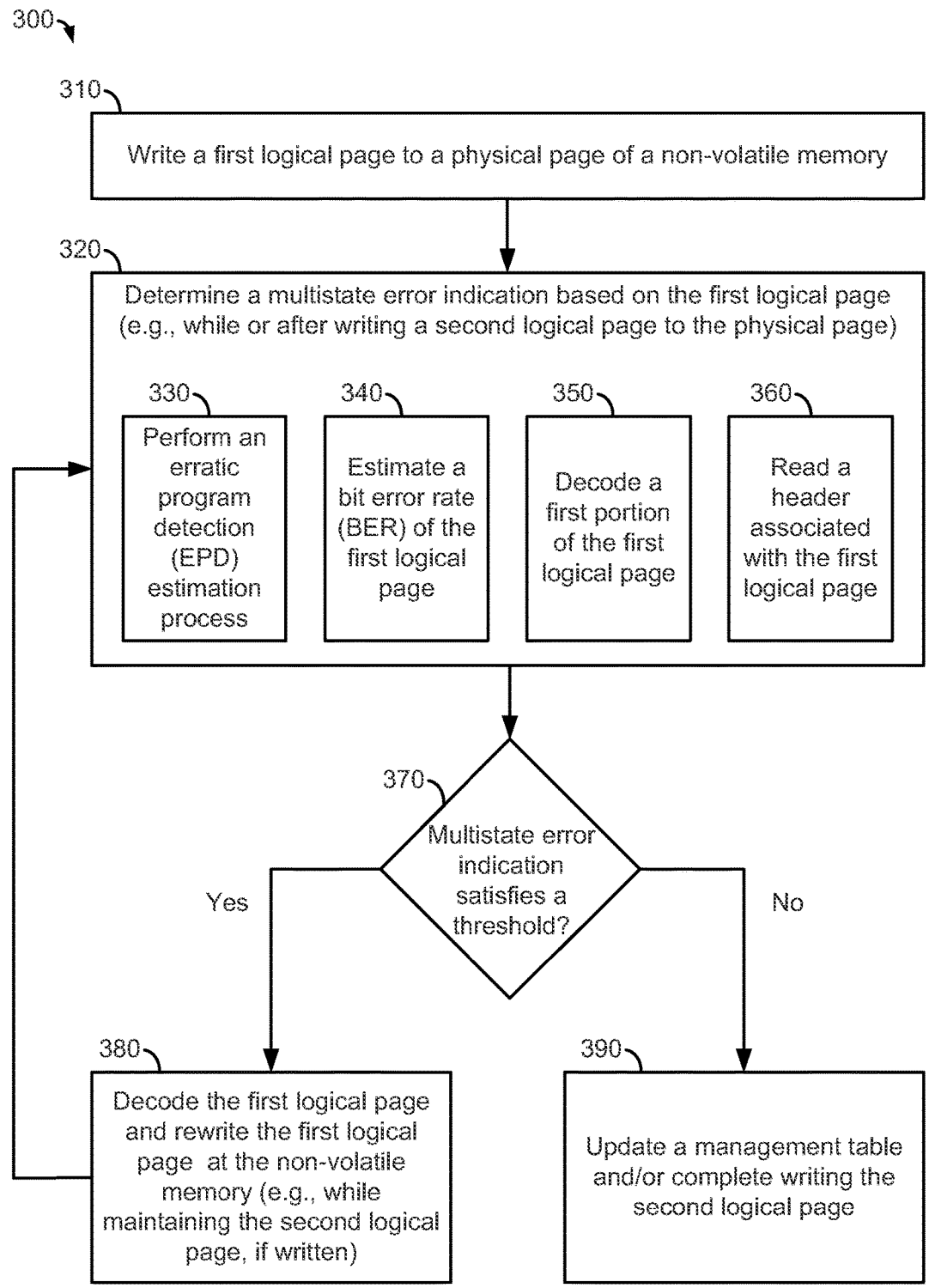
FIG. 3 is a flow diagram of a particular illustrative embodiment of a method of operating the data storage device of FIG. 1.

Referring to FIG. 3, a particular illustrative embodiment of a method is depicted and generally designated 300. The method 300 may be performed in the data storage device 102, such as by the controller 126.

The method 300 may include writing a first logical page to a physical page of a non-volatile memory, at 310. The physical page may correspond to the physical page 112, and the non-volatile memory may correspond to the non-volatile memory 104. In a particular embodiment, the first logical page corresponds to the logical page 114.

The method 300 further includes determining a multistate error indication based on the first logical page, at 320. The multistate error indication may correspond to the multistate error indication 150. The multistate error indication may be determined while or after writing a second logical page (e.g., the logical page 116) to the physical page. That is, the multistate error indication may be determined concurrently with writing the second logical page, or the multistate error indication may be determined after writing both the first logical page and the second logical page.

To further illustrate, the first logical page and the second logical page may be written in accordance with a multistage write process. A particular example multistage write process may include writing the logical page 114 to the physical page 112, which may result in a program state corresponding to the histogram 202. The multistage write process may further include copying the logical page 114 from the physical page 112 to the latch portion 108 and copying the logical pages 114, 116 from the latch portion 108 to the physical page 112, which may result in a program state corresponding to the histogram 208.

In a particular embodiment, the data storage device 102 determines the multistate error indication during the multistage write process. For example, the data storage device 102 may determine the multistate error indication upon copying the logical page 114 from the physical page 112 to the latch portion 108. The data storage device 102 may access the logical page 114 from the latch portion 108 to determine the multistate error indication. After accessing the logical page 114 from the latch portion 108, the data storage device 102 may determine the multistate error indication concurrently with copying the logical pages 114, 116 from the latch portion 108 to the physical page 112 during the multistage write process. In another embodiment, the data storage device 102 determines the multistate error indication after completing the multistage write process. For example, the data storage device 102 may determine the multistate error indication after copying the logical pages 114, 116 from the latch portion 108 to the physical page 112. Certain data storage devices attempt to correct errors in a lower page prior to initiating a multistage write process. However, because most pages are not expected to contain a high number of errors, a data storage device in accordance with the present disclosure may check for errors during (or following) the multistage write process to check for errors in the lower page. If a page is determined to have a high error rate, the page may be rewritten at the non-volatile memory 104 (e.g., at a different memory location of the non-volatile memory 104). Because most pages statistically will not have high error rates, such a technique typically does not incur appreciable latency at the data storage device 102.

The multistate error indication may be determined according to a particular technique. The technique may analyze the first logical page to determine information that indicates whether one or more multistate errors likely have occurred while writing the second logical page or likely will occur while writing the second logical page. Example techniques for determining the multistate error indication are described further below.

According to a first technique, the method 300 may further include performing an erratic program detection (EPD) estimation process, at 330. The erratic program detector 130 may perform the EPD estimation process 330, such as by accessing the logical page 114 from the latch portion 108 during the multistage write process.

To illustrate, the EPD estimation process 330 may utilize multiple sense operations at each of the storage elements 113. The multiple sense operations may utilize multiple read voltages. Referring again to FIG. 2, the multiple sense operations may use the read voltages V1, V2 alternatively or in addition to the read voltage V0. The read voltages V1, V2 may differ from the read voltage V0 by minus and plus a voltage difference (Vd), respectively (e.g., V1=V0−Vd and V2=V0+Vd). In a particular embodiment, the erratic program detector 130 senses each of the storage elements 113 at the read voltages V1, V2 to determine a number of storage elements that are programmed to an "intermediate" threshold voltage that is greater than V1 and that is less than V2. In this example, the multistate error indication may correspond to the number of storage elements programmed to an "intermediate" threshold voltage as determined by the erratic program detector 130. For example, the multistate error indication may include a parameter indicating the number of storage elements that are programmed to an "intermediate" threshold voltage as determined by the erratic program detector 130. If the non-volatile memory 104 includes multiple memory dies, the EPD estimation process may be performed in parallel for two or more of the multiple memory dies. In a particular embodiment, the erratic program detector 130 is included in the non-volatile memory 104, and the EPD estimation process is performed internally at the non-volatile memory 104 (e.g., at the latch portion 108) without data transfer to the controller 126.

According to a second technique, the method 300 may further include estimating a bit error rate (BER) of the first logical page, at 340. For example, the BER estimator 134 may analyze the first logical page to determine the BER of the first logical page. The BER of the first logical page may be determined without decoding the first logical page by the decoder 140, such as by estimating a number of bit errors of the first logical page without decoding through the errors to determine an actual error rate of the first logical page. In an illustrative embodiment, the BER estimator 134 or the decoder 140 determines an ECC codeword "syndrome" of the first logical page that indicates the BER of the first logical page. It should be appreciated that determination of the BER (and other operations described herein) may be performed "internally" to the non-volatile memory 104 (e.g., "on-die" at a die that includes the non-volatile memory 104) or "externally" to the non-volatile memory 104, such as at a die that includes the controller 126.

A high BER of the first logical page may indicate that one or more multistate errors likely have occurred while writing the second logical page or are likely to occur while writing the second logical page. For example, a high BER may indicate over-programming or under-programming of one or more storage elements, which may lead to one or more multistage errors during a multistage write process. In this example, the multistate error indication corresponds to the BER. For example, the multistate error indication may include a parameter indicating the BER of the first logical page.

According to a third technique, the method 300 may further include decoding a first portion of the first logical page, at 350. To illustrate, the decoder 140 may decode part, but not all, of the first logical page, such as by decoding a "sample" portion of the first logical page. As an illustrative example, the decoder 140 may decode one of the portions 120, 122 without decoding the other of the portions 120, 122. The decoder 140 may determine a decoded error rate of the decoded portion of the first logical page. In this example, the multistate error indication corresponds to the decoded error rate of the decoded portion. For example, the multistate error indication may include a parameter indicating the decoded error rate of the decoded portion.

According to a fourth technique, the method 300 may further include reading a header (e.g., a preamble or a "flag") associated with the first logical page, at 360. The header may correspond to the header 118. The header may be unprotected by any ECC technique. As a particular example, the header may be protected via a "repetition" code that repeats each bit of the header instead of via a "full" ECC technique (e.g., BCH, LDPC, or another ECC technique). Accordingly, if the header can be correctly read by the controller 126, then the first logical page may have been written reliably. Alternatively, if the header includes a large number of errors (e.g., causing the header to be read incorrectly by the controller 126), then the controller 126 may determine that the first logical page likely contains one or more errors associated with one or more multistate errors during multistage programming. In this example, the multistate error indication corresponds to the error rate of the header. For example, the multistate error indication may include a parameter indicating the error rate of the header. It will be appreciated that fourth technique may be implemented at the non-volatile memory 104 or at the controller 126.

The method 300 may further include determining whether the multistate error indication satisfies a threshold, at 370. Referring again to the first example, determining whether the multistate error indication satisfies the threshold may include comparing the number of storage elements programmed to an "intermediate" threshold voltage to a threshold number of storage elements. Referring again to the second example, determining whether the multistate error indication satisfies the threshold may include comparing a BER of the first logical page to a BER threshold. Referring again to the third example, determining whether the multistate error indication satisfies the threshold may include comparing a decoded error rate of a sample of the first logical page to a decoded error rate threshold. Referring again to the fourth example, determining whether the multistate error indication satisfies the threshold may include comparing an error rate of a header of the first logical page to an error rate threshold.

If the multistate error indication satisfies the threshold, the method 300 may further include decoding the first logical page and rewriting the first logical page at the non-volatile memory, at 380. For example, the first logical page may be sent to the decoder 140 for decoding and/or error correction and then rewritten to the non-volatile memory 104 after error correction by the decoder 140. In a particular embodiment, the first logical page is rewritten to a recovery block of the non-volatile memory 104. The recovery block may correspond to the SLC portion 106. The controller 126 may invalidate the copy of the first logical page stored at the physical page (e.g., by updating the management table 146) and may update the management table 146 to indicate that a logical address associated with the first logical page corresponds to a physical address of a location of the non-volatile memory 104 at which the first logical page is rewritten (e.g., the recovery block).

In a particular embodiment, if writing the second logical page has been completed at the physical page by the time the first logical page is to be rewritten, then the copy of the first logical page stored at the physical page is invalidated and the second logical page is indicated as being valid (or maintained as being valid) at the management table 146. To illustrate, the management table 146 may be updated to indicate that the copy of the first logical page stored at the physical page is invalid, that the second logical page stored at the physical page is valid, and that the rewritten copy of the first logical page is valid. In another embodiment, if writing the second logical page is not completed (e.g., is only partially completed), then all data at the physical page may be invalidated. In this example, the first logical page and the second logical page may both be rewritten at the non-volatile memory 104 (e.g., at the physical page 112, at physical pages of the SLC portion 106, or at another location).

After rewriting the first logical page, at 380, the method 300 may continue by determining a second multistate error indication of the first logical page, at 320, as illustrated by the example of FIG. 3. The method 300 may continue, such as by determining whether the second multistate error indication satisfies the threshold, at 370.

If the multistate error indication (or the second multistate error indication) fails to satisfy the threshold, the method 300 further includes updating a management table and/or completing writing of the second logical page, at 390. For example, the management table 146 may be updated to indicate that the physical page stores two valid logical pages (e.g., the logical page 114 and the logical page 116, when written).

The method 300 enables reduction of multistate errors in data stored at a memory. For example, by identifying a multistate error indication upon writing the first logical page, one or more multistate errors may be corrected during the multistage write process. Alternatively or in addition, an error-detecting read process may be utilized to correct one or more multistate errors in written data, such as one or more multistate errors that occur during upper page programming or during a read operation. An example error-detecting read process is described further with reference to FIG. 4.

Figure 4:
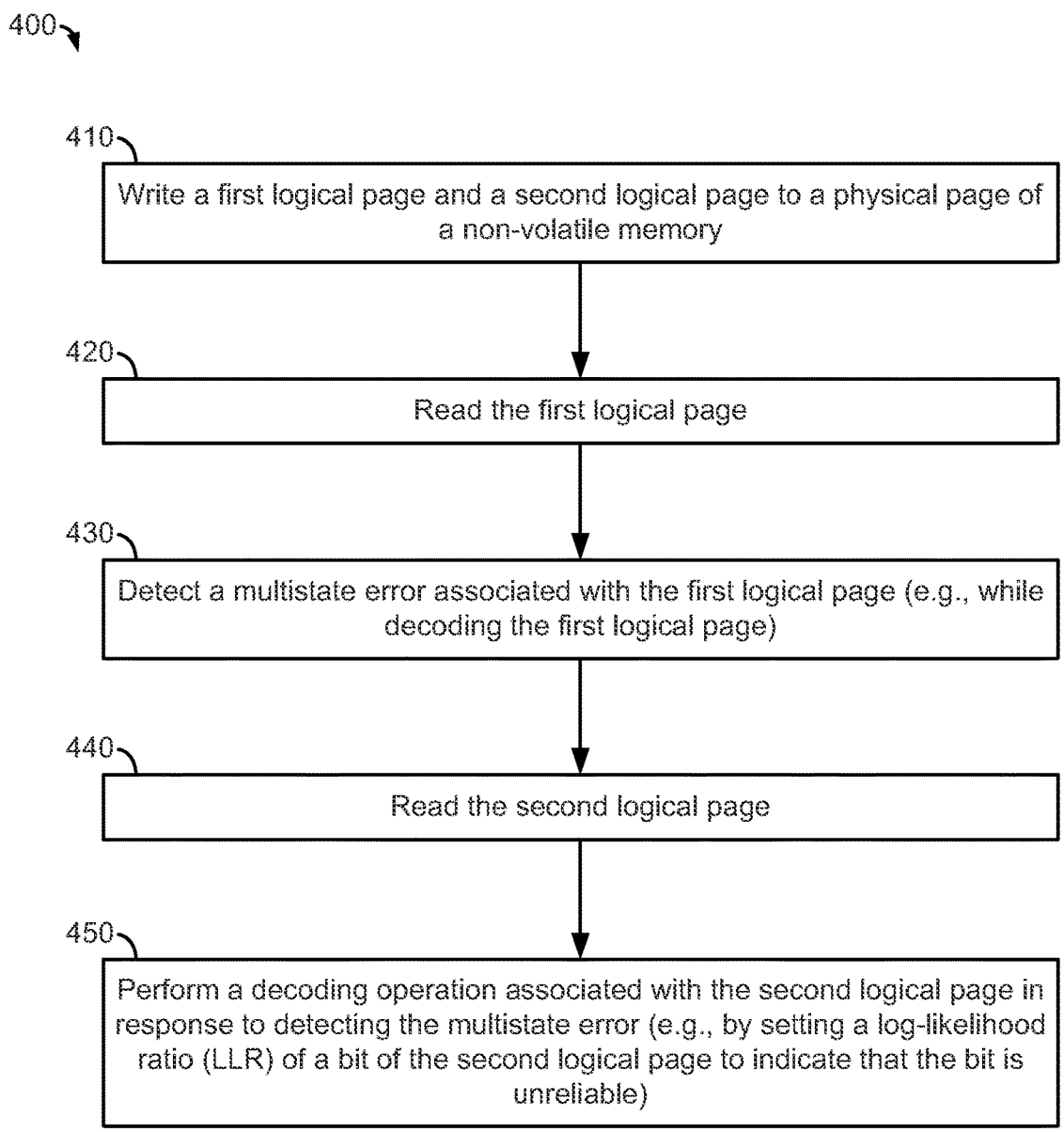
FIG. 4 is a flow diagram of another particular illustrative embodiment of a method of operating the data storage device of FIG. 1.

Referring to FIG. 4 a particular embodiment of a method is depicted and generally designated 400. The method 400 may be performed in the data storage device 102, such as by the controller 126. The method 400 may be performed alternatively or in addition to the method 300. As a particular example, the method 300 may be performed during a write operation, and the method 400 may be performed during a read operation. Alternatively, the method 400 may utilize different data than the method 300.

The method 400 may include writing a first logical page and a second logical page to a physical page of a non-volatile memory, at 410. The first logical page may correspond to the logical page 114, and the second logical page may correspond to the logical page 116. Alternatively, the first logical page and the second logical page may correspond to other logical pages not shown in FIG. 1. The physical page may correspond to the physical page 112, and the non-volatile memory may correspond to the non-volatile memory 104. The first logical page and the second logical page may be written in connection with a multistage write process, such as the multistage write process described with reference to FIG. 1. For example, the first logical page may correspond to a lower page, and the second logical page may correspond to an upper page.

The method 400 may further include reading the first logical page, at 420. As an example, the controller 126 may send a read command to the non-volatile memory 104 via the connection 124 to access the first logical page (e.g., in response to a request for read access received from the host device 158). In response to the read command, the non-volatile memory 104 may access the first logical page, such as by reading the logical page 114 from the physical page 112 and returning data corresponding to the logical page 114 to the controller 126 via the connection 124.

The method 400 may further include detecting a multistate error associated with the first logical page, at 430. To illustrate, the controller 126 may initiate a decoding operation at the decoder 140 to decode the logical page 114. The decoder 140 may be configured to detect "bit flips" in the logical page 114. To illustrate, referring again to FIG. 2, a lower page bit value targeted for an erase state but that is instead programmed to a "C" state (or vice versa) causes a "bit flip." The decoder 140 may be configured to track the bit location of each such bit flip. For example, if the nth bit in the logical page 114 is a "flipped bit," then the decoder 140 may track that the nth bit in the logical page 114 contains a bit error.

The method 400 may further include reading the second logical page, at 440. As an example, the controller 126 may send a read command to the non-volatile memory 104 via the connection 124 to access the logical page 116 (e.g., in response to a request for read access received from the host device 158). In response to the read command, the non-volatile memory 104 may access the logical page 116, such as by reading the logical page 116 from the physical page 112 and returning data corresponding to the logical page 116 to the controller 126 via the connection 124.

The method 400 may further include performing a decoding operation associated with the second logical page in response to detecting the multistate error, at 450. For example, the decoder 140 may set a log-likelihood ratio (LLR) corresponding to a bit of the logical page 116 to indicate that the bit is unreliable (e.g., by setting the LLR to a zero value). The LLR may correspond to the LLR 142. Continuing with the above example, if the nth bit of the logical page 114 contains an error, then the decoder 140 may set an LLR associated with the nth bit of the logical page 116 to indicate that the nth bit of the logical page 116 is unreliable.

Setting LLRs associated with bits of the second logical page based on one or more bit errors associated with the first logical page may improve decoding of the second logical page. For example, in certain iterative decoding schemes, the decoder 140 may perform multiple calculations to determine an LLR. By setting the value of an LLR based on a bit error of the first logical page, the decoder 140 may decode the second logical page using fewer iterations. Further, the method 400 may be utilized to manage one or more multistate errors that occur even after correctly programming a lower page. For example, the method 400 may be performed to manage one or more errors that occur while programming an upper page and/or errors that occur during a read operation. Accordingly, the method 400 may improve performance of a data storage device, such as by improving speed and efficiency of one or more decoding operations, resulting in faster data accesses.

Figure 5:
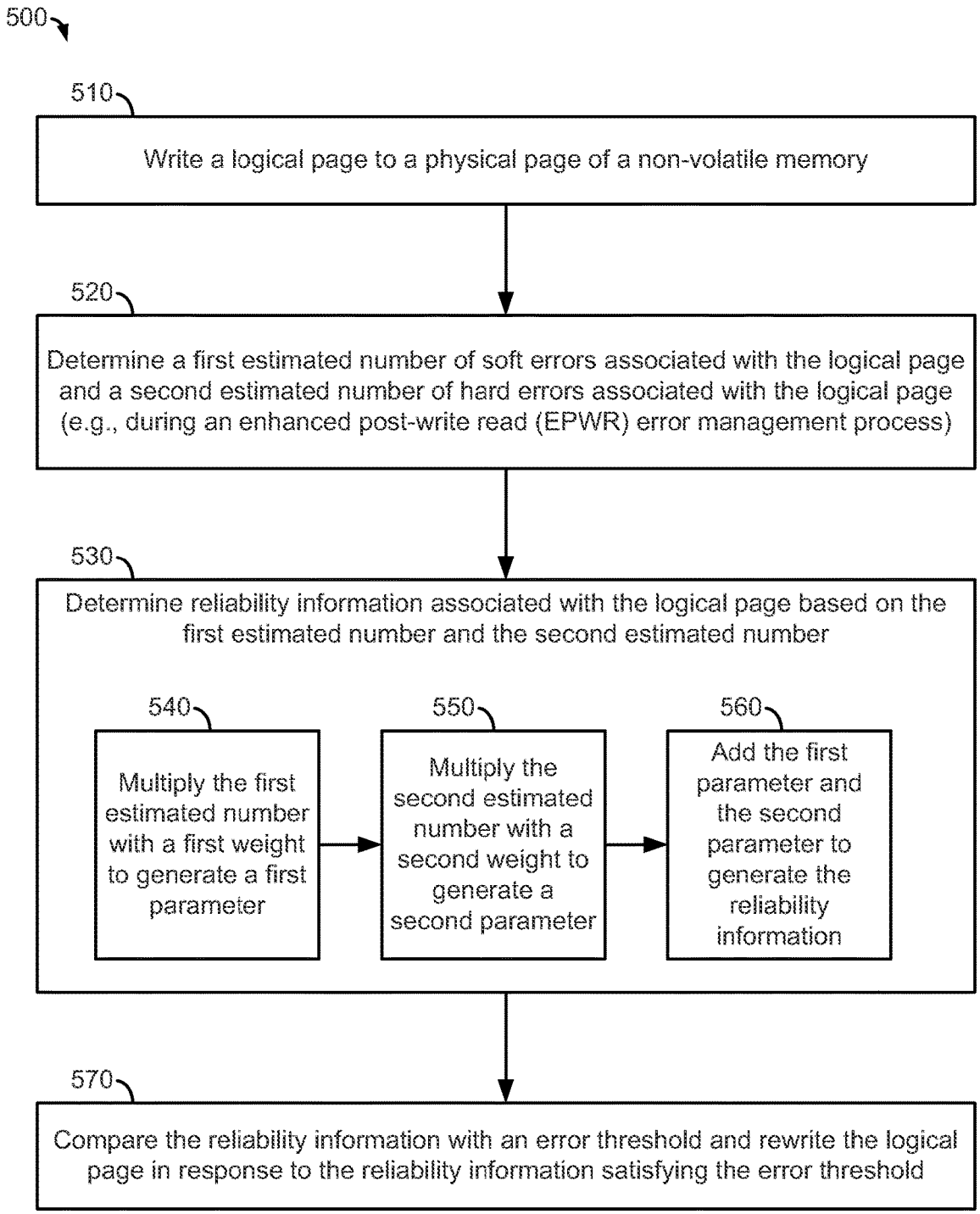
FIG. 5 is a flow diagram of another particular illustrative embodiment of a method of operating the data storage device of FIG. 1.

Referring to FIG. 5, a particular illustrative embodiment of a method is depicted and generally designated 500. The method 500 may be performed in the data storage device 102, such as by the controller 126. The method 500 may correspond to a post-write technique that may be utilized to verify reliability of data upon programming the data at the non-volatile memory 104. The method 500 may be performed alternatively or in addition to one or both of the methods 300, 400.

The method 500 may include writing a logical page to a physical page of a non-volatile memory, at 510. The logical page may correspond to the logical page 114 or the logical page 116. The physical page may correspond to the physical page 112, and the non-volatile memory may correspond to the non-volatile memory 104.

The method 500 may further include determining a first estimated number of soft errors associated with the logical page and a second estimated number of hard errors associated with the logical page, at 520. To illustrate, the number of soft errors may correspond to a number of threshold voltages that fall within one or more overlap regions, such as the overlap region 220. The number of hard errors may correspond to a number of errors that fall within one or more non-overlap regions, such as the non-overlap region 218. In a particular embodiment, the first estimated number and the second estimated number are determined during an enhanced post write read (EPWR) error management process that is performed by the controller 126 upon writing the logical page.

The method 500 may further include determining reliability information associated with the logical page based on the first estimated number and the second estimated number, at 530. The reliability information may correspond to the reliability information 152. The reliability information may be determined using a particular technique. An example technique is described below for illustrative purposes.

According to the example technique, the method 500 may further include multiplying the first estimated number with a first weight to generate a first parameter, at 540. The method 500 may further include multiplying the second estimated number with a second weight to generate a second parameter, at 550. The method 500 may further include adding the first parameter and the second parameter to generate the reliability information, at 560. The first weight and/or the second weight may be selected based on a particular soft error tolerance and/or hard error tolerance of a particular ECC technique utilized by the decoder 140 (e.g., an error correction capability of the decoder 140). Because certain ECC techniques may be more tolerant to soft errors than hard errors, the first weight may be less than the second weight.

The method 500 may further include comparing the reliability information with an error threshold and rewriting the logical page in response to the reliability information satisfying the error threshold, at 570. Alternatively, if the reliability information does not satisfy the error threshold, the logical page may be maintained at the physical page. The management table 146 may be updated to indicate a location of the logical page.

The error threshold may be selected based on an error correction capability of the decoder 140. For example, based on a particular ECC technique utilized by the decoder 140, the decoder 140 may have a particular error correction capability (e.g., a capability to decode data having a certain percentage of errors). The error threshold may be selected such that logical pages having an error rate that exceeds the error correction capability of the decoder 140 (as indicated by the reliability information) are rewritten at the non-volatile memory 104. The error threshold may be selected such that logical pages having an error rate that does not exceed the error correction capability of the decoder 140 (as indicated by the reliability information) are not rewritten at the non-volatile memory 104.

The method 500 enables post-write error management of data that is written at the data storage device 102. For example, the method 500 may be used in connection with an EPWR technique to improve data reliability. Improving reliability upon writing data using the method 500 may simplify decoding operations, such as by rewriting data that includes a large number of errors to correct the errors prior to initiating a read operation to read the data. The method 500 may therefore improve performance of a data storage device.

Figure 6:
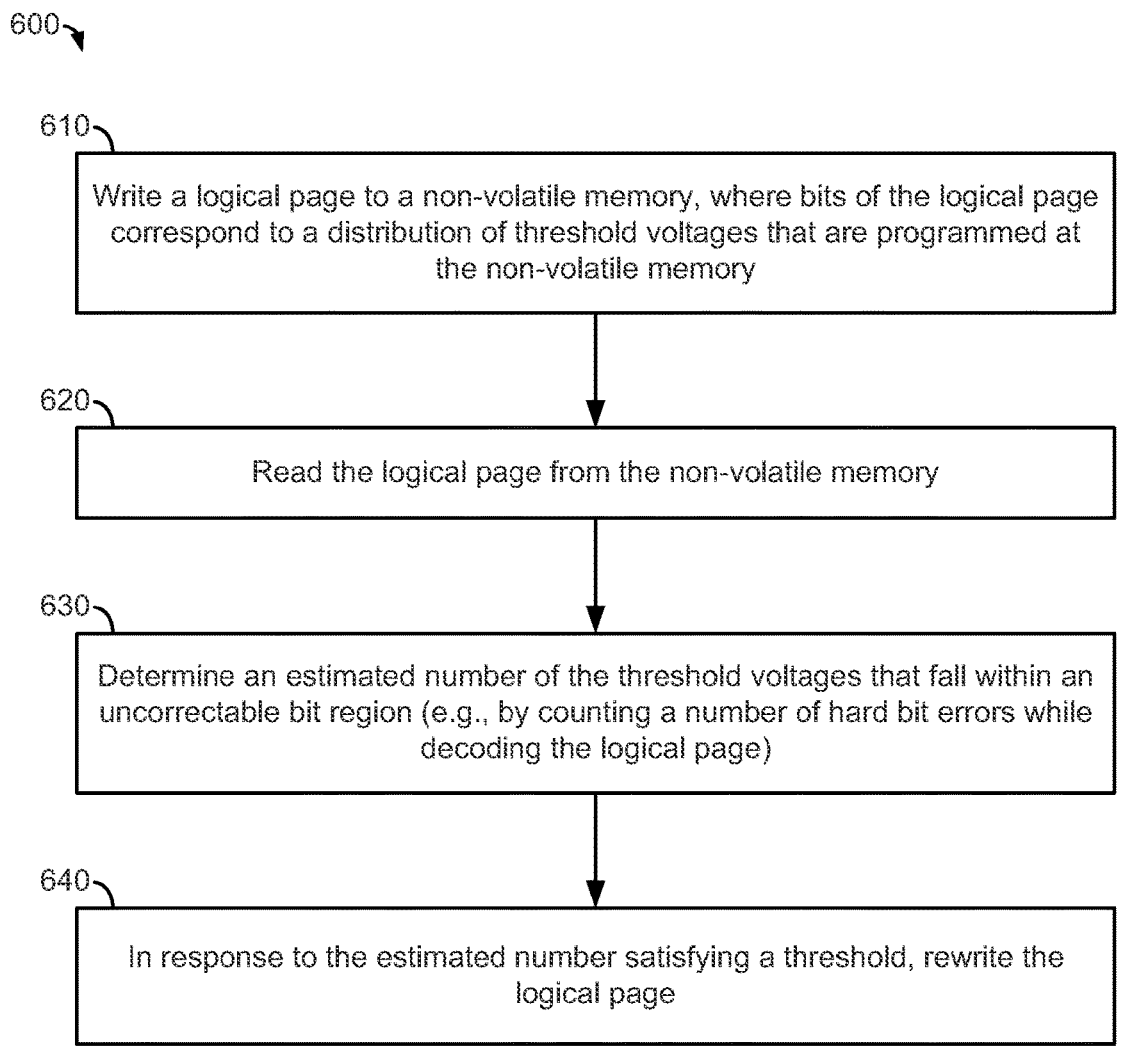
FIG. 6 is a flow diagram of another particular illustrative embodiment of a method of operating the data storage device of FIG. 1.

Referring to FIG. 6, a particular illustrative embodiment of a method is depicted and generally designated 600. The method 600 may be performed in the data storage device 102, such as by the controller 126. The method 600 may be performed alternatively or in addition to one or more of the methods 300, 400, and 500.

The method 600 may include writing a logical page to a non-volatile memory, at 610. The logical page may correspond to one of the logical pages 114, 116, and the non-volatile memory may correspond to the non-volatile memory 104. Bits of the logical page may correspond to a distribution of threshold voltages that are programmed at the non-volatile memory. For example, bits of the logical page may correspond to threshold voltages indicated by any of the histograms 202, 208, and 226.

The method 600 may further include reading the logical page from the non-volatile memory, at 620. As an example, the controller 126 may send a read command to the non-volatile memory 104 via the connection 124 to access the logical page (e.g., in response to a request for read access received from the host device 158). In response to the read command, the non-volatile memory 104 may access the first logical page, such as by reading the logical page 114 from the physical page 112 and returning data corresponding to the logical page 114 to the controller 126 via the connection 124.

The method 600 may further include determining an estimated number of the threshold voltages that fall within an uncorrectable bit region, at 630. The uncorrectable bit region may correspond to the uncorrectable bit region 222. The uncorrectable bit region may correspond to a range of threshold voltages that are not within a threshold distance of a target threshold voltage state (e.g., an erase state, an "A" state, a "B" state, or a "C" state). In a particular embodiment, the estimated number is determined by counting a number of hard bit errors that occur while decoding the logical page.

The method 600 may further include rewriting the logical page in response to the estimated number satisfying a threshold, at 640.

Figure 7:
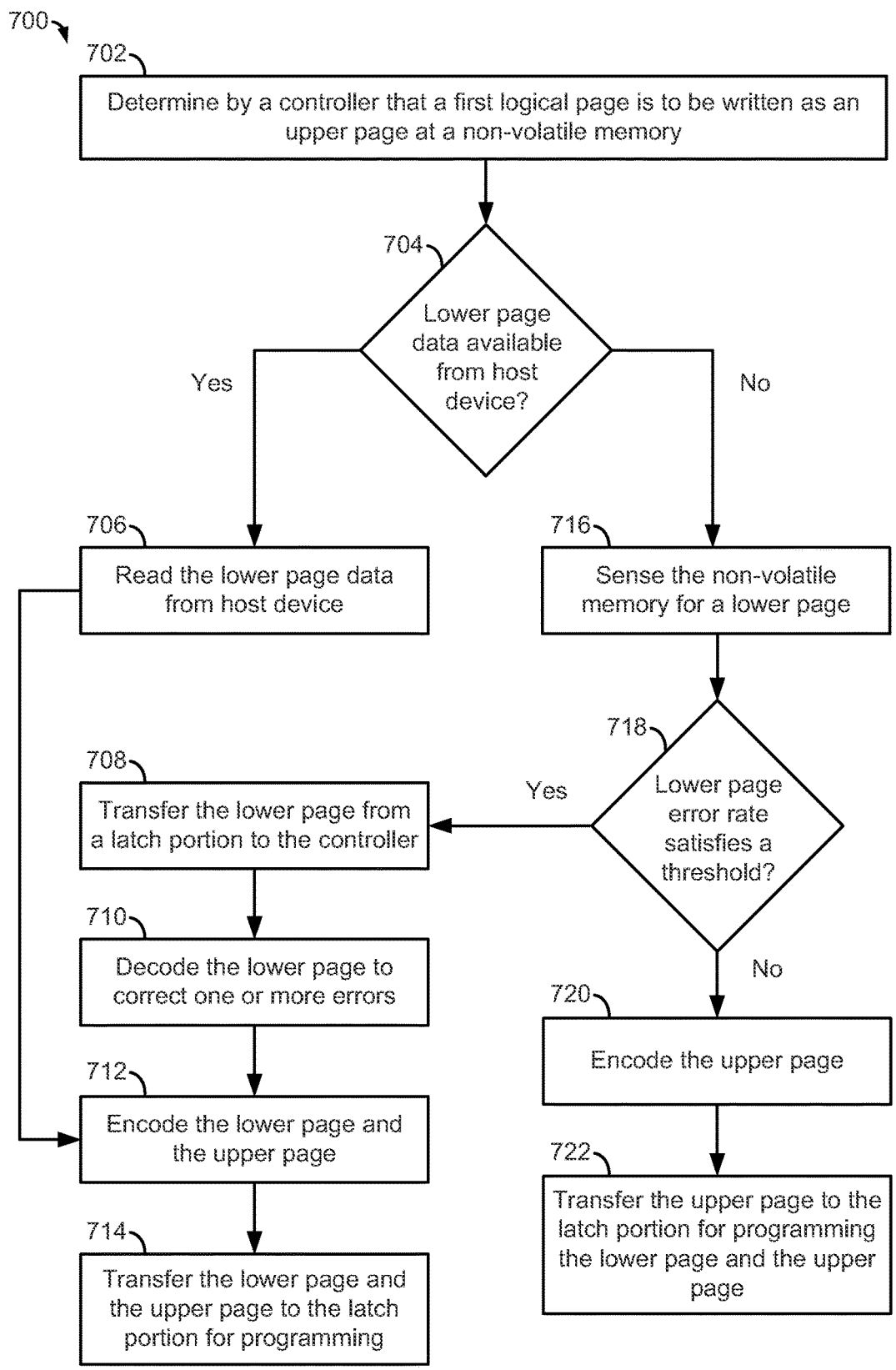
FIG. 7 is a flow diagram of another particular illustrative embodiment of a method of operating the data storage device of FIG. 1.

Referring to FIG. 7, a particular illustrative embodiment of a method is depicted and generally designated 700. The method 700 may be performed in the data storage device 102, such as by the controller 126. The method 700 may be performed alternatively or in addition to one or more of the methods 300, 400, 500, and 600.

The method 700 may include determining by a controller that a first logical page is to be written as an upper page at a non-volatile memory, at 702. For example, the controller 126 may determine that the first logical page is related to a second logical page that is stored at the non-volatile memory 104, such as by determining that the first logical page and the second logical page are included in a common file. The controller 126 may determine that the first logical page and the second logical page are to be written to a common physical page of the non-volatile memory 104, such as the physical page 112. The first logical page and the second logical page may correspond to the logical pages 116, 114, respectively.

The method 700 may further include determining whether lower page data is available from a host device, at 704. For example, the controller 126 may query the host device 158 to determine whether data corresponding to the lower page is available at the host device 158 (e.g., is cached at the host device). If the data corresponding to the lower page is available at the host device, the method 700 may further include reading the lower page data from the host device, at 706. The method 700 may further include encoding the lower page and the upper page, at 712, and transferring the lower page and the upper page to a latch portion for programming, at 714. The latch portion may correspond to the latch portion 108. Upon transferring the lower page and the upper page to the latch portion 108, the lower page and the upper page may be written to the MLC portion 110, such as at the physical page 112.

If the data corresponding to the lower page is unavailable at the host device, the method 700 may further include sensing the non-volatile memory for the lower page, at 716. For example, the controller 126 may sense data corresponding to (or including) the lower page from a location of the non-volatile memory 104 into the latch portion 108. The method 700 may further include determining whether the lower page error rate satisfies a threshold, at 718. For example, the controller 126 may determine the multistate error indication 150 in a manner illustrated by any of the techniques described with reference to the method 300 of FIG. 3 and may compare the multistate error indication 150 to the threshold.

If the lower page error rate satisfies the threshold, the method 700 may further include transferring the lower page from the latch portion to the controller, at 708, and decoding the lower page to correct one or more errors, at 710. For example, the logical page 114 may be transferred from the latch portion 108 to the controller 126 for decoding by the decoder 140.

If the lower page error rate fails to satisfy the threshold, the method 700 may further include encoding the upper page, at 720. The method 700 may further include transferring the upper page to the latch portion for programming the lower page and the upper page, at 722. Upon transferring the upper page to the latch portion 108, the lower page and the upper page may be written to the physical page 112, as an illustrative example.

The method 700 enables reduced multistate errors in data in addition to low latency associated with error correction. For example, certain devices may be configured such that sensed lower page data is error-corrected each time the lower page data is sensed. These devices may reduce a multistate error rate of stored data, but at the expense of increased latency associated with transferring each sensed lower page to a controller for decoding. Other devices may "ignore" any errors in the lower page in order to avoid the latency associated with transferring the lower page to the controller for decoding. However, these devices may accrue high multistate error rates in stored data, potentially causing uncorrectable data errors. The method 700 of FIG. 7 may enable both low latency and low multistate error rates. For example, because most pages are not statistically expected to have a high error rate, a few pages may be transferred to the controller for error correction (e.g., full decoding by the decoder 140), thus causing reduced (or no) latency while also enabling low multistate error rates.

Although one or more components described herein are illustrated as block components and described in general terms, such components may include one or more microprocessors, state machines, or other circuits configured to enable the data storage device 102 (or one or more components thereof) to perform operations described herein. For example, one or more components described herein may correspond to one or more physical components, such as hardware controllers, state machines, logic circuits, one or more other structures, or a combination thereof, to enable the data storage device 102 to perform one or more operations described herein. One or more aspects of the data storage device 102 may be implemented using a microprocessor or microcontroller programmed to perform operations described herein, such as one or more operations of the methods 300, 400, 500, 600, and 700. Further, one or more operations described herein may be performed at the non-volatile memory 104 (e.g., "on-flash" ECC decoding, as an illustrative example) alternatively or in addition to performing such operations at the controller 126. In a particular embodiment, the data storage device 102 includes a processor executing instructions that are stored at the non-volatile memory 104. Alternatively or in addition, executable instructions that are executed by the processor may be stored at a separate memory location that is not part of the non-volatile memory 104, such as at a read-only memory (ROM).

To further illustrate, the controller 126 may include a processor that is configured to execute instructions to perform certain operations (e.g., an algorithm) described herein. The instructions may include general purpose instructions, and the processor may include a general purpose execution unit operable to execute the instructions. The processor may access the instructions from the non-volatile memory 104, the RAM 144, another memory location, or a combination thereof. The processor may execute the instructions to write a first logical page to a physical page of the non-volatile memory 104, such as by executing instructions that cause the processor to send the logical page 114 and a write command to the non-volatile memory 104 via the connection 124. The write command may identify a physical address associated with the physical page 112. For example, an argument of the write command may indicate the physical address associated with the physical page 112. The processor may execute the instructions to rewrite the logical page 114 at the non-volatile memory 104 in response to a multistate error indication satisfying a threshold, such as by executing instructions that cause the processor to send the logical page 114 and a write command to the non-volatile memory 104 via the connection 124. The multistate error indication may correspond to the multistate error indication 150. The multistate error indication may be determined based on the logical page 114 using one or more techniques described herein, such as using the example techniques described with reference to FIG. 3.

The data storage device 102 may be attached to or embedded within one or more host devices, such as within a housing of a host communication device, which may correspond to the host device 158. For example, the data storage device 102 may be integrated within a packaged apparatus such as a mobile telephone, a music player, a video player, a gaming device or console, an electronic book reader, a personal digital assistant (PDA), a computer, such as a laptop, a tablet, or a notebook computer, a portable navigation device, or other device that uses internal non-volatile memory. However, in other embodiments, the data storage device 102 may be implemented in a portable device configured to be selectively coupled to one or more external devices, such as the host device 158.

To further illustrate, the data storage device 102 may be configured to be coupled to the host device 158 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The non-volatile memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the non-volatile memory 104 may include another type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device that includes a non-volatile memory and a controller, wherein the non-volatile memory includes a single-level cell (SLC) portion and a latch portion, performing, at the controller:
writing a first logical page to a physical page of the non-volatile memory;
rewriting the first logical page at the SLC portion of the non-volatile memory in response to a multistate error indication satisfying a threshold, wherein the multistate error indication is determined based on the first logical page;
encoding a second logical page in response to determining that the multistate error indication fails to satisfy the threshold; and
transferring the first logical page and the second logical page to the latch portion for programming at a multi-level cell (MLC) portion of the non-volatile memory.

2. The method of claim 1, wherein determining the multistate error indication includes performing an erratic program detection (EPD) process by an erratic program detector by performing multiple sense operations on each storage element of the physical page.

3. The method of claim 1, wherein determining the multistate error indication includes estimating a bit error rate (BER) of the first logical page, and wherein the BER is estimated by a BER estimator without decoding the first logical page.

4. The method of claim 1, wherein determining the multistate error indication includes decoding a first portion of the first logical page, and wherein the first logical page includes at least a second portion that is not included in the first portion.

5. The method of claim 1, wherein determining the multistate error indication includes reading a header associated with the first logical page.

6. The method of claim 1, further comprising performing a decoding operation associated with the second logical page in response to a detected multistate error.

7. The method of claim 6, wherein the detected multistate error is associated with the first logical page.

8. The method of claim 1, wherein data is stored at the physical page, wherein the first logical page is a lower page of the data, and wherein the second logical page is an upper page of the data.

9. The method of claim 1, further comprising:
reading the second logical page from a particular physical page of the non-volatile memory, wherein the particular physical page stores the second logical page and a third logical page; and
performing a decoding operation associated with the third logical page in response to detecting a multistate error associated with the second logical page.

10. The method of claim 9, wherein the decoding operation includes setting a log-likelihood ratio (LLR) parameter of a bit of the third logical page to indicate that the bit is unreliable.

11. The method of claim 1, further comprising:
writing the second logical page at the non-volatile memory; and
rewriting the second logical page in response to reliability information associated with the second logical page indicating that the second logical page is unreliable, wherein the reliability information indicates a first estimated number of soft errors associated with the second logical page and further indicates a second estimated number of hard errors associated with the second logical page.

12. The method of claim 11, wherein the first estimated number indicates a first estimated number of error bits of the second logical page that are associated with one or more overlap regions between states indicating bit values of the second logical page, and wherein the second estimated number indicates a second estimated number of error bits of the second logical page that are within one or more non-overlap regions of the states.

13. The method of claim 11, further comprising:
multiplying the first estimated number with a first weight to generate a first parameter;
multiplying the second estimated number with a second weight to generate a second parameter; and
adding the first parameter and the second parameter to generate the reliability information.

14. The method of claim 13, further comprising comparing the reliability information with an error threshold, wherein the second logical page is rewritten in response to determining that the reliability information satisfies the error threshold.

15. The method of claim 11, wherein the reliability information is determined in connection with an enhanced post-write read (EPWR) error management process.

16. The method of claim 1, further comprising:
reading the second logical page from the non-volatile memory, wherein bits of the second logical page correspond to a distribution of threshold voltages that are programmed at the non-volatile memory; and
in response to a number of the threshold voltages that fall within an uncorrectable bit region satisfying a threshold, rewriting the second logical page.

17. The method of claim 16, wherein the uncorrectable bit region corresponds to a range of threshold voltages, and wherein the range of threshold voltages cannot be corrected using soft bit information.

18. The method of claim 16, further comprising determining the number by counting a number of hard bit errors while decoding the second logical page.

19. A data storage device comprising:
a non-volatile memory that includes a single-level cell (SLC) portion and a latch portion; and
a controller, wherein the controller is communicatively coupled to the non-volatile memory, wherein the controller is configured to write a first logical page to a physical page of the non-volatile memory, wherein the controller is further configured to rewrite the first logical page at the non-volatile memory in response to a multistate error indication satisfying a threshold, wherein the multistate error indication is determined based on the first logical page, wherein the controller is further configured to encode a second logical page in response to determining that the multistate error indication fails to satisfy the threshold, and wherein the controller is further configured to transfer the first logical page and the second logical page to the latch portion for programming at a multi-level cell (MLC) portion of the non-volatile memory.

20. The data storage device of claim 19, wherein the controller is further configured to:
perform a decoding operation associated with the second logical page in response to a multistate error associated with the first logical page:
determine reliability information that indicates a first estimated number of soft errors associated with the first logical page and that further indicates an estimated number of hard errors associated with the first logical page: and
determine an estimated number of threshold voltages corresponding to the first logical page that fall within an uncorrectable bit region.

21. The data storage device of claim 19, wherein the controller is further configured to determine a second multistate error indication of the first logical page upon rewriting the first logical page.

22. The data storage device of claim 21, wherein the controller includes a random access memory (RAM) that is configured to store a management table, and wherein the controller is further configured to update the management table in response to the second multistate error indication failing to satisfy the threshold.

23. The data storage device of claim 19, wherein the first logical page is a lower page, and wherein the second logical page is an upper page that corresponds to the lower page.

24. The data storage device of claim 19, wherein the controller is further configured to query a host device for the first logical page prior to determining the multistate error indication, and wherein the controller is further configured to sense the first logical page from the non-volatile memory and to determine the multistate error indication in response to determining that the first logical page is unavailable at the host device.

25. An apparatus comprising:
means for storing data, wherein the means for storing data includes a single-level cell (SLC) portion and a latch portion; and
means for controlling the means for storing data, wherein the means for controlling is communicatively coupled to the means for storing data, wherein the means for controlling is configured to write a first logical page to a physical page of the means for storing data, wherein the means for controlling is further configured to rewrite the first logical page at the means for storing data in response to a multistate error indication satisfying a threshold, wherein the multistate error indication is determined based on the first logical page, wherein the means for controlling is further configured to encode a second logical page in response to determining that the multistate error indication fails to satisfy the threshold, and wherein the means for controlling is further configured to transfer the first logical page and the second logical page to the latch portion for programming at a multi-level cell (MLC) portion of the means for storing data.

26. The apparatus of claim 25, wherein the means for controlling is further configured to determine the multistate error indication at least in part by performing an erratic program detection (EPD) process that includes performing multiple sense operations on each storage element of the physical page.

* * * * *